United States Patent [19]

Mikagi

[11] Patent Number: 5,502,005
[45] Date of Patent: Mar. 26, 1996

[54] PRODUCTION METHOD OF SEMICONDUCTOR DEVICE HAVING A WIRING LAYER CONTAINING GOLD

[75] Inventor: Kaoru Mikagi, Tokyo, Japan

[73] Assignee: NEC Corporation, Tokyo, Japan

[21] Appl. No.: 160,351

[22] Filed: Nov. 29, 1993

[30] Foreign Application Priority Data

Nov. 27, 1992 [JP] Japan ..................... 4-341419

[51] Int. Cl.$^6$ .................................. H01L 21/44
[52] U.S. Cl. ........................... 437/195; 437/192
[58] Field of Search .................... 437/195, 192, 437/203, 246

[56] References Cited

U.S. PATENT DOCUMENTS 3,657,029   4/1972   Fuller ........................... 156/11
4,970,574  11/1990   Tsunenari .

FOREIGN PATENT DOCUMENTS 57-54364   3/1982   Japan .
4199624    7/1992   Japan .

OTHER PUBLICATIONS

"A Process for Two–Layer Gold IC Metallization", *Solid State Technology*, Doug Summers, Dec. 1983, Beaverton, Oregon, pp. 137–141.

"Multilevel Gold Metallization by use of Selective W–CVD and Polymide Siloxane Film", *Proceedings of 6th IEEE V–MIC Conference*, K. Mikagi et al., Jun. 12–13, 1989, pp. 33–39.

"Multilevel Gold Metallization", *Proceedings of 5th IEEE V–MIC Conference*, K. Haberle et al., Jun. 13–14, 1988, pp. 117–124.

*Primary Examiner*—George Fourson
*Assistant Examiner*—C. Everhart
*Attorney, Agent, or Firm*—Young & Thompson

[57] ABSTRACT

A production method of a semiconductor device which has a first insulator film formed directly or through at least one layer on a semiconductor substrate, a wiring film containing gold (Au) and formed on the first insulator film, a metal layer covering the surface of the wiring film, and a second insulator film formed on the metal layer to cover its surface. The metal layer is made through an absorption process or phenomenon of a metal included in the metal layer. Preferably, the metal layer is made of tungsten (W) or molybdenum (Mo) and the wiring film is made of a gold (Au) layer and at least one electroconductive layer stacked. An improved adhesion between the wiring layer and an insulator film formed thereon can be obtained.

19 Claims, 5 Drawing Sheets

(Prior Art)

FIG. 3

(Prior Art)

PRODUCTION METHOD OF SEMICONDUCTOR DEVICE HAVING A WIRING LAYER CONTAINING GOLD

BACKGROUND OF THE INVENTION

1. Field of the Invention

The present invention relates to a production method of a semiconductor device and more particularly, to a production method of a semiconductor device having a wiring layer containing mainly gold (Au).

2. Description of the Related Art

A multilayer wiring film containing a gold layer has been largely expected to be suited to high density semiconductor devices due to the fact that it has superior characteristics such as low electric resistance, high resistance to migration and so on. With the wiring film, however, there arises such a large problem that cannot provide a good adhesion between the wiring film and a dielectric or insulation film formed thereon. Under such a circumstance, a lot of sorts of techniques have been developed in order to solve such the problem as follows;

(1) An adhesion dielectric film having a good adhesion property is formed on the multilayer wiring film and then, an insulator film is formed thereon thereby to enhance the adhesion between the wiring and insulator films. The adhesion dielectric layer is made of (A) an inorganic material or (B) an organic material.

(2) An adhesion metal film having a good adhesion property is formed on the multilayer wiring film and then, an insulator film is formed thereon thereby to enhance the adhesion between the wiring and insulator films. The adhesion metal film is made by (A) a selective growth method or (B) a patterning metal film formed over the entirety of a semiconductor substrate.

Figure 1A:
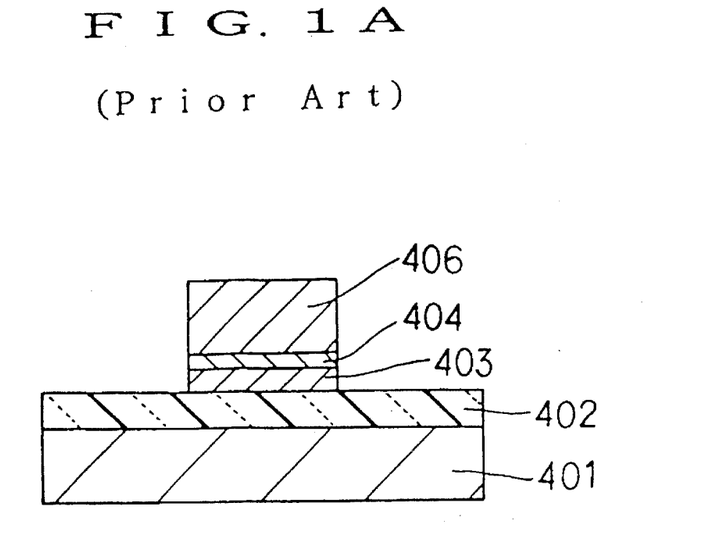
FIGS. 1A and 1B are partial cross-sectional views showing a prior art production method of a semiconductor device, respectively.
Figure 1B:
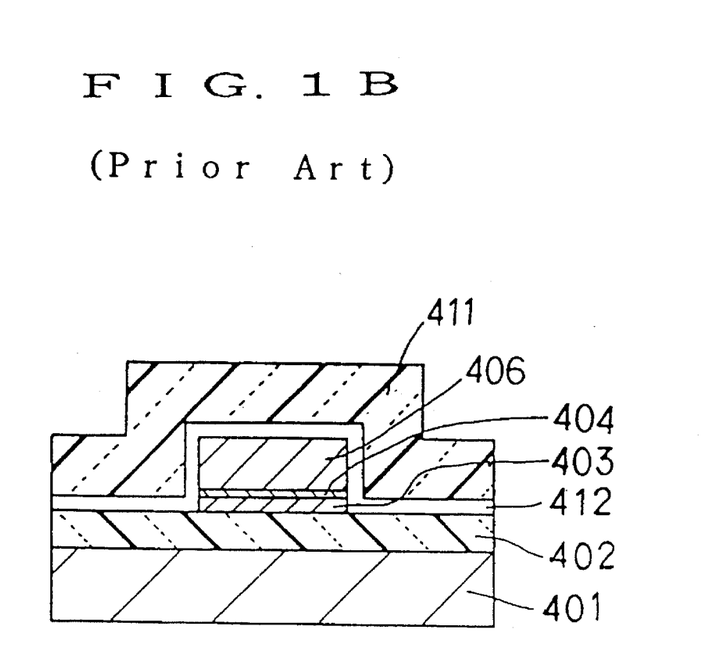

FIGS. 1A and 1B cross-sectionally show a semiconductor device according to the above technique (1)(A), which is disclosed in "Solid State Technology", December 1983, pp. 137 to 141, First, as shown in FIG. 1A, on a silicon substrate 401 a silicon dioxide film 402 is formed by a thermal oxidation or plasma-enhanced Chemical Vapor Deposition (CVD) technique. Subsequently, a film 403 made of an Titanium and tungsten (Ti—W) alloy having a 10% Ti content is formed thereon by a Direct Current (DC) magnetron sputtering technique, and a palladium (Pd) film 404 is formed thereon by the same DC magnetron sputtering technique.

Next, a photoresist film is selectively formed on the Pd film 404 by a photo-lithography technique. With the photoresist film as a mask, a gold (Au) film 406 is selectively formed on the Pd film 404 by an electrolytic plating technique. The photoresist film is removed, and then the Pd film 404 and the Ti—W film 403 are successively etched off with the plated Au film 406 as a mask. As a result, the multilayer wiring film composed of the Ti—W film 403, Pd film 404 and plated Au film 406 is obtained as shown in FIG. 1A.

Next, in order to improve the adhesion between the multilayer wiring film and an oxide film 411, on the top and side surfaces of the wiring film and the exposed surface of the silicon dioxide film 401, an adhesion layer 412 made of a plasma-deposited silicon nitride film, which is evaluated to be comparatively intimately adhesive to gold, is formed at a thickness of 25 to 30 nm.

Finally, the plasma-deposited silicon dioxide film 411 is formed on the adhesion layer 412 at a thickness of about 750 nm. Thus, the structure shown in FIG. 1B is obtained.

A gold film may be used instead of the Pd film 404.

In this case, the adhesion layer 412 of plasma-deposited silicon nitride is formed by the plasma-enhanced CVD technique under the conditions that source gas flows are at the ratio of $SiH_4/NH_3/N_2=205/280/580$ sccm, an atmosphere temperature is 300° C., a gas pressure is 0.23 Torr and an input electric power is 500 W. The film 411 of plasma-deposited silicon oxide is formed by the plasma-enhanced CVD technique under the condition that gas flows are at the ratio of $SiH_4/N_2O=70/1900$ sccm, an atmosphere temperature is 300° C., a gas pressure is 0.38 Torr and an input electric power is 500 W.

Figure 2:
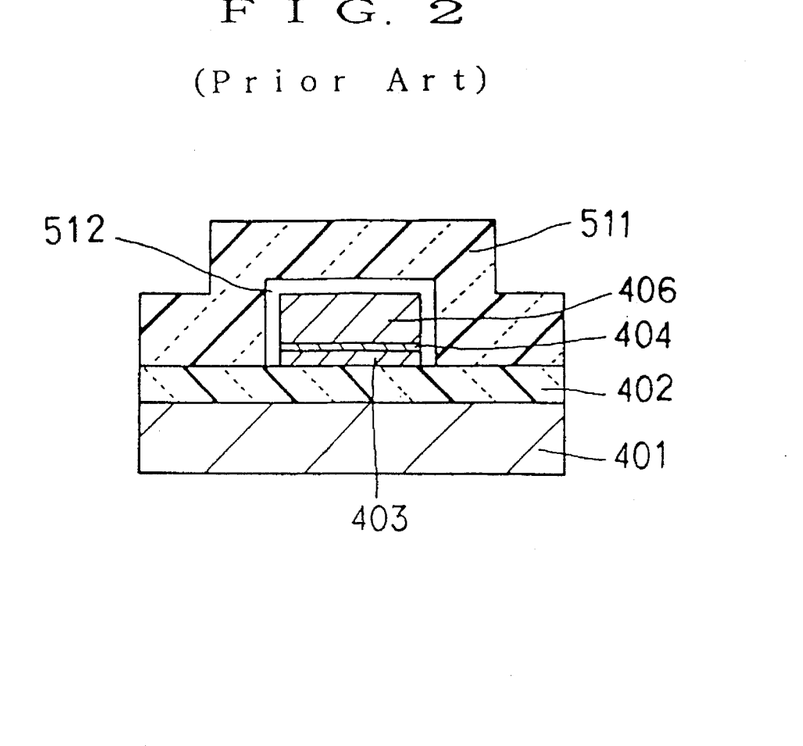
FIG. 2 is a partial cross-sectional view showing another prior art production method of a semiconductor device.

FIG. 2 cross-sectionally shows a semiconductor device according to the above technique (2)(A), which is disclosed by K. Mikagi et. al. in "Proceedings of 6th IEEE V-MIC conference", Jun. 1989, pp. 33 to 39.

This semiconductor device is similar to that in FIGS. 1A and 1B excepting the composition and forming process of an adhesion layer 512 and a second dielectric film 511 formed on the gold wiring. Components of the device in FIG. 2 having the same functions as those in FIGS. 1A and 1B are indicated by the same reference numerals and their explanations will be omitted for the sake of simplification.

First, a multilayer wiring film made of a Ti—W film 403, a Pd film 404 and an plated Au film 406 is formed on a silicon substrate 401 through the same processes as those in FIGS. 1A and 1B.

Next, an adhesion layer 512 of tungsten (W) is selectively formed on only the top surface of the multilayer wiring film by a CVD technique using tungsten fluoride ($WF_6$) as a source gas and hydrogen silicide or silane ($SiH_4$) as a reducing gas. A insulator film 511 of an organic material is formed on the entire surface of the W adhesion layer 512 and the exposed surface of a silicon dioxide film 402. Thus, the structure shown in FIG. 2 is obtained.

Due to the W adhesion layer 512 the adhesion between the multilayer wiring film and the organic insulator film 511 can be improved.

In the paper by K. Mikagi et. al., in the CVD process for forming selectively the tungsten film 512, a cold-wall type reaction chamber is employed, and the CVD process is preferably carried out under the conditions that an atmosphere temperature is 180° to 250° C., source gas flows are at the ratio of $WF_6/(WF_6+SiH_4)=0.4$ to 0.6 and a gas pressure is 10 to 100 mTorr from the viewpoints of growth selectivity and quality of the tungsten film 512.

In addition, the following techniques can be employed for obtaining the adhesion layer; A first one is that the W adhesion layer of tungsten is formed by the reduction of tungsten fluoride ($WF_6$) with hydrogen ($H_2$) instead of the reduction of $WF_6$ with hydrogen silicide ($SiH_4$)

A second one is that a non-electrolytic plating technique is employed. In the non-electrolytic plating technique, for example, the Si substrate 401 containing the multilayer wiring film is immersed into a palladium chloride ($PdCl_2$) solution as a pre-treatment and then, immersed into a non-electrolytic plating solution for obtaining the W adhesion layer 512. The plating solution is isothermally held and contains nickel sulfate as its main component and dimethylamine borane as a reducing agent and other additives, whose Ph is substantially neutral.

A third one is that a high adhesive conductor film is formed as an adhesion layer on the entire surface of the gold wiring, then patterned and thereafter, a dielectric film is formed thereon.

Figure 3:
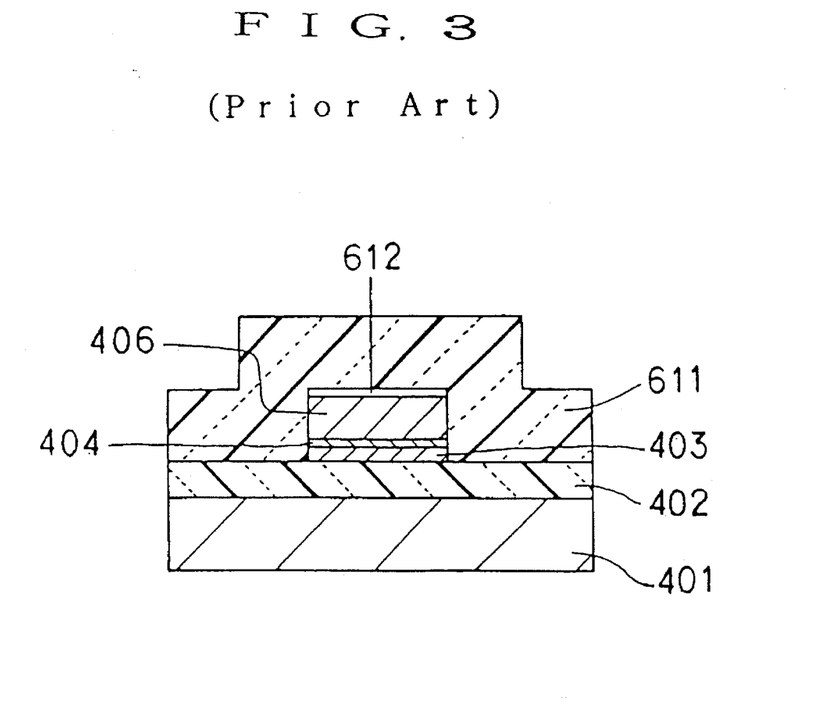
FIG. 3 is a partial cross-sectional view showing still another prior art production method of a semiconductor device.

FIG. 3 is a cross-sectional view of a semiconductor device according to the above technique(2)(B), which is disclosed by K. Haberle, et. al. in "Proceedings of 5th IEEE V-MIC Conference", Jun. 1988, pp. 117 to 124.

First, a multilayer wiring film made of a Ti—W film 403, a Pd film 404 and an plated Au film 406 is formed on a silicon substrate 401 through the same processes as those in FIGS. 1A and 1B.

On the surface of the wiring film and the exposed surface of the silicon dioxide film 402 an adhesion layer 612 of chromium (Cr) is formed over the substrate 401. Then, the Cr adhesion layer is patterned to be left only on the top surface of the Au plated film 406. Subsequently, on the surface of the adhesion layer 612 and the exposed surface of the silicon dioxide film 402 a dielectric film 611 is formed. Thus, the structure shown in FIG. 3 is obtained.

The following technique is additionally described in the paper by K. Haberle as an adhesion layer made of an organic material is formed on the multilayer wiring film instead of that of an inorganic material shown in FIGS. 1A and 1B, which is corresponding to the above technique (1)(B).

The above-described conventional techniques individually have their own problems as follows;

In the case of the plasma-deposited silicon nitride film being employed as an adhesion layer, the film cannot always provide a sufficiently high adhesion property, so that the possibility of peeling between the wiring film and the adhesion layer due to thermal hysteresis during production process and/or deterioration with time in use exists. As a result, it is difficult to realize the multilayer wiring film at a high production yield, and a long-term reliability of the device cannot be obtained.

Furthermore, the adhesion layer made of plasma-deposited silicon nitride has a high dielectric constant and as a result, the interlayer capacity will be increased thereby to degrade the characteristics of the semiconductor device itself.

In the case where the adhesion layer is selectively grown by a CVD or non-electrolytic plating technique on the surface of the wiring film, a severe or strict process control is required and yet, even if the process is strictly controlled there is a possibility that the growth of the adhesion material such as tungsten does not become sufficiently selective. As a result, an interlayer short-circuit will occur and the production yield will be reduced.

In the case where the adhesion layer made of chromium or the like is selectively grown or formed on the multilayer wiring film, a large number of processes are required, and the production cost will be increased disadvantageously. In the case of patterning the adhesion layer of chromium or the like formed over the entirety of the substrate, it is difficult to apply this process to the minute wiring applications from the viewpoint of mask alignment accuracy and/or processing accuracy.

In the case of using an organic material as the adhesion layer, the insulator or dielectric film to be formed on the adhesion layer it is required for using an organic material for formation. However, any semiconductor device having the dielectric film of an organic material is not satisfactorily matched to the present semiconductor production process, and as a result, the degree of freedom of design will be lowered and there arises a disadvantageous problem on productivity.

SUMMARY OF THE INVENTION

Accordingly, an object of the present invention is to provide a production method of a semiconductor device which allows an improved adhesion between a wiring layer containing gold and an insulator or dielectric film formed thereon.

Another object of the present invention is to provide a production method of a semiconductor device in which the number of production steps does not increase and the production yield is not reduced.

Still another object of the present invention is to provide a production method of a semiconductor device in which a severe or strict process control in the production process is not required.

A production method of a semiconductor device of the present invention comprises a first step of forming a first insulator film directly or through at least one layer on a semiconductor substrate, a second step of forming a wiring film containing gold (Au) on the first insulator film, a third step of forming an absorbed metal layer on the surface of the wiring film by contacting the wiring film with a halogenide gas of the metal, and a fourth step of forming a second insulator film on the absorbed metal layer to cover its surface.

In a preferred embodiment of the second aspect, a tungsten (W) halogenide gas or molybdenum (Mo) halogenide gas is used.

In another preferred embodiment thereof, between the third and fourth steps, a step of converting the metal halogenide adhered onto the first insulator film into a metal oxide by putting the halogenide into an atmosphere containing oxygen.

There may be provided a step of heat-treating the absorbed metal layer under a non-oxidative atmospheric condition to stabilize the absorbed metal layer between the third and fourth steps.

With the production method of a semiconductor device, the absorbed metal layer is employed as an adhesion layer instead of a silicon nitride film which causes peeling due to thermal hysteresis during production process or distortion with time in use, so that the adhesion between the wiring film and the second insulator film can be improved thereby to provide a long-term reliability of the semiconductor device.

In addition, since the absorbed metal layer is formed by contacting the wiring film with a halogenide gas of the metal, a selective growth using the CVD or nonelectrolytic plating technique is not required. As a result, the number of production processes does not increase and the production yield is not reduced.

Further, a severe or strict process control in the production process is not required and no problem about mask alignment accuracy and/or processing accuracy arises.

DETAILED DESCRIPTION OF THE PREFERRED EMBODIMENTS

Preferred embodiments of the present invention will be described below with reference to the drawings attached.

[First Embodiment]

Figure 4A:
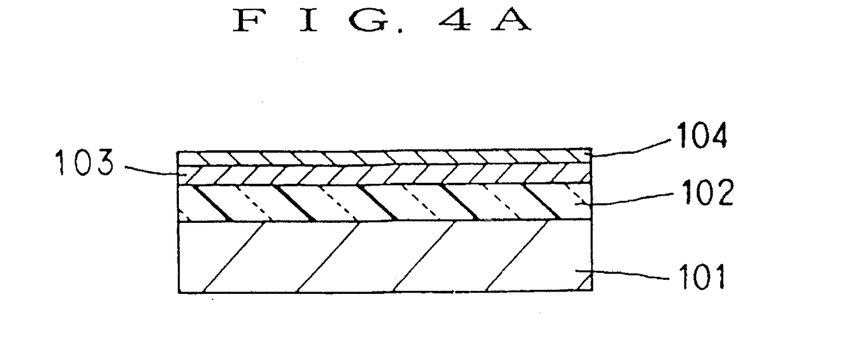
FIGS. 4A to 4F are partial cross-sectional views showing a production method of a semiconductor device according to a first embodiment of the present invention, respectively.
Figure 4B:
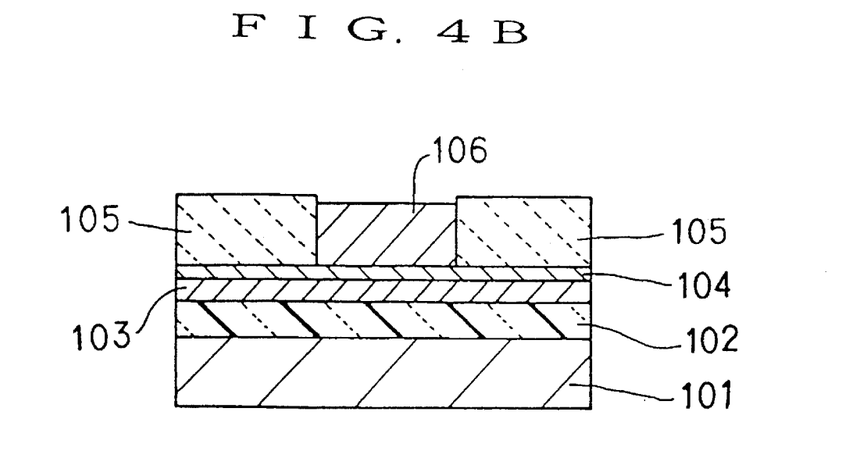
Figure 4C:
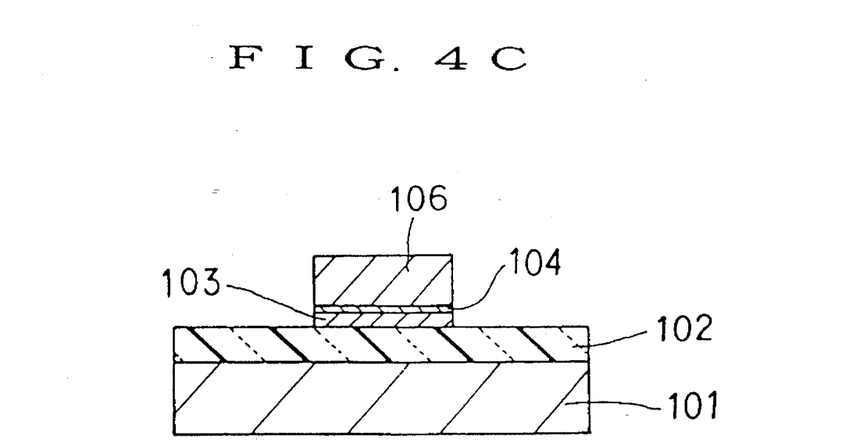
Figure 4D:
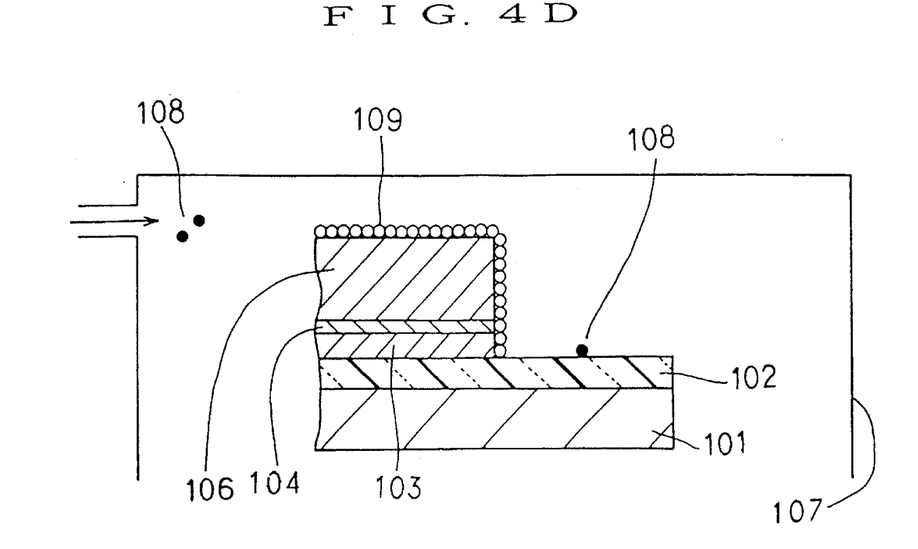
Figure 4E:
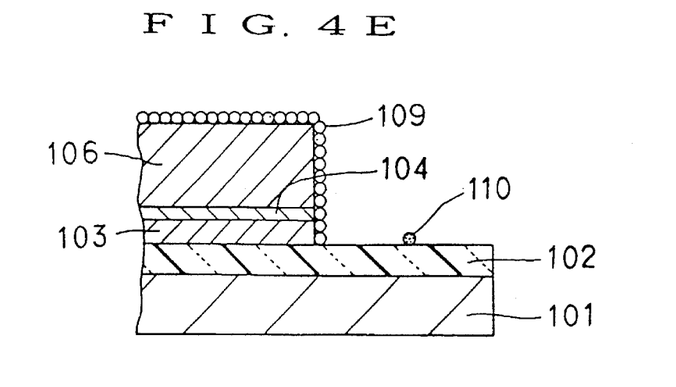
Figure 4F:
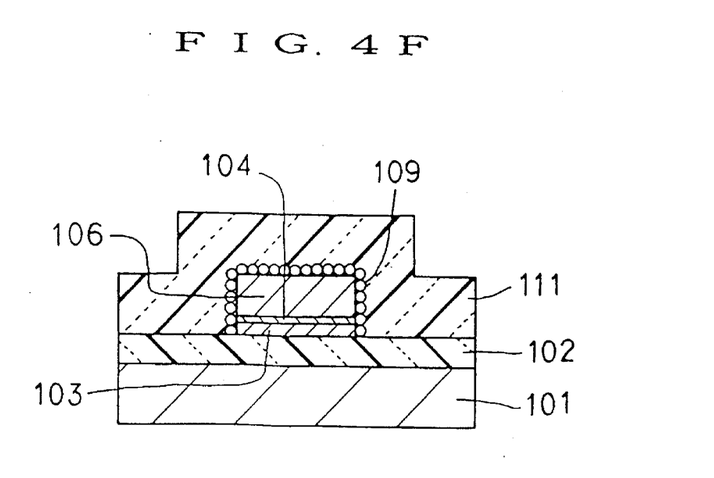

In FIG. 4F, on a silicon substrate 101 a first insulator film 102 of silicon dioxide and having a thickness of 500 nm is formed. On the first insulator film 102 a first conductor layer 103 of a Ti—W alloy having a 10 wt % Ti content, which has a thickness of 100 to 200 nm is formed.

A second conductor layer 104 of gold (Au) having a thickness of 10 to 50 nm is formed on the first conductor layer 103. The second conductor layer 104 is not limited to be formed of gold but may be formed of palladium (Pd), platinum (Pt) or the like. A third conductor film 106 made by plating and having a thickness of 500 to 1500 nm is formed on the second conductor layer 104.

The Ti—W first conductor layer 103, Au second conductor layer 104 and Au third conductor layer 106 which are stacked and patterned form a multilayer wiring film. The top and side surfaces of the multilayer wiring film are covered with a thin absorbed tungsten layer 109. The layer 109 is obtained through an absorption process or phenomenon of the metal tungsten by contacting the wiring film with a tungsten halogenide gas.

The entire surface of the tungsten layer 109 and the exposed surface of the first insulator film 102 are covered with a second insulator film 111 made of silicon dioxide and having a thickness of 500 to 1000 nm. The second insulator film 111 is not limited to be made of silicon dioxide but may be made of any organic material such as polyimide having a small dielectric constant effective for reduction of interlayer capacity.

The first conductor layer 103 at the lowest is provided as a barrier for preventing atoms of the second and third conductor layers 104 and 106 formed thereon from diffusing into active regions within the substrate 101. The first conductor layer 103 also functions to provide good adhesion to the first insulator film 102 formed thereunder.

The second conductor layer 104 at the middle functions to provide good adhesion between the third conductor layer 106 formed thereon and the first conductor layer 103 formed thereunder as well as to protect the surface of the first conductor layer 103 from a plating solution.

The third conductor layer 106 at the top functions mainly as a wiring layer of the semiconductor device.

Next, a production method of the semiconductor device of the first embodiment will be described below with reference to FIGS. 4A to 4F.

First, as shown in FIG. 4A, on the surface of the silicon substrate 101 the $SiO_2$ first insulator film 102 is formed by a thermal oxidation technique or a plasma-enhanced CVD technique using hydrogen silicide or silane ($SiH_4$) and nitrogen oxide ($N_2O$) as raw-material gases. Then, the Ti—W first conductor layer 103 is formed thereon by applying a DC magnetron sputtering technique under the conditions of a film formation power of 1.0 to 4.0 kW and the gas pressure of 2 to 10 mTorr.

Subsequently, the Au second conductor layer 104 is formed on the Ti—W first conductor layer 103 by applying the same DC magnetron sputtering technique under the conditions of a film formation power of 0.2 to 1.0 Kw and a gas pressure of 2 to 10 Mtorr. The Au second conductor layer 104 ensures to maintain the plating current supplying path and facilitates stable growth of an Au film when the Au third conductor layer 106 is formed thereon by a plating technique.

As shown in FIG. 4B, a photoresist film 105 having a thickness of 1000 to 2000 nm is formed on the Au second conductor layer 104 by a photolithography technique using a g-line or i-line and then patterned. The Au third conductor layer 106 is selectively formed on the exposed surface of the Au second conductor layer 104 by an electrolytic plating technique with the photoresist film 105 as a mask.

A plating solution used in the electrolytic plating technique is composed of sodium gold sulfate and sulfuric acid as its main components and additives including a flattening agent, Ph stabilizer and the like. This plating solution is in general a non-cyanic solution containing about 10 g of gold per liter and is substantially neutral in pH, or 6.0 to 8.0.

It is preferable from the viewpoint of film quality and uniformity to perform the plating process under the conditions of a plating temperature of 35° to 65° C. and a supplying current density of 1 to 4 $mA/cm^2$.

It is possible to use a cyanic electrolytic gold plating solution instead of the above-described non-cyanic solution.

Next, the photoresist film 105 is removed by a wet etching technique using an organic solvent or by an ashing technique using an oxygen plasma. Then, with the Au third conductor layer 106 as a mask, the exposed surface of the Au second conductor layer 104 is removed by an etching technique and the exposed surface of the Ti—W first conductor layer 103 is subsequently removed by the same technique. Thus, as shown in FIG. 4C, the multilayer wiring film composed of the first, second and third conductor layers 103, 104 and 106 is obtained on the first insulator film 102.

In the case of sequentially removing the first and second conductor layers 103 and 104 by a wet etching technique, the first conductor layer 103 is etched off by using a hydrogen peroxide and water solution with a concentration of 20 to 100% at an ambient temperature of 25° to 45° C. On the other hand, the second conductor layer 104 is etched off by using an aqua regia with a concentration of 10 to 20 wt % at an ambient temperature of 25° to 50° C. or by using an $NH_4I/I_2$ solution instead of the aqua regia.

In the case of sequentially removing the first and second conductor layers 103 and 104 by only a dry etching technique, an ion milling technique using argon gas independently, or a reactive ion etching (RIE) technique using a fluorine-system gas such as carbon fluoride ($CF_4$), sulfur fluoride ($SF_6$) or the like, is applied in combination with the ion milling technique. Furthermore, heat-treatment is applied to the multilayer wiring film at a temperature of 300° to 400° C. for 30 to 60 minutes in an inert gas or forming gas atmosphere in order to stabilize the wiring film.

Subsequently, as shown in FIG. 4D, the Si substrate 101 having the structure shown in FIG. 4C is deposited in a reaction chamber 107 and a tungsten fluoride ($WF_6$) gas is introduced into the chamber 107. The substrate 101 is exposed for 5 to 10 minutes to the tungsten fluoride ($WF_6$) gas under the atmospheric condition of a temperature of 150° to 400° C. and a gas pressure of 200 mTorr. This process is hereinafter called an "absorption process".

During the absorption process, molecules 108 of the tungsten fluoride gas are absorbed on the surface of the multilayer wiring film, and the fluorine (F) atoms are dissociated due to the energy transfer reaction with the free electrons existing in the surface of the wiring film. The fluorine atoms thus generated are absorbed on the surface of the wiring layer to form the tungsten layer 109. The tungsten atoms are coupled with the gold atoms by the metallic bonds. The dissociated fluorine atoms are dissipated in the atmosphere.

The absorbed tungsten layer 109 is as extremely small in thickness as several ones to ten nm and low in coupling or bonding force to the surface of the wiring film as well as unstable in structure compared with that obtained through the reduction with hydrogen silicide ($SiH_4$) or hydrogen ($H_2$). If the tungsten layer 109 is intended to be thicker, it is necessary to increase the partial pressure of the tungsten fluoride gas and the temperature in the absorption process.

On the other hand, the absorption rate of the tungsten fluoride gas molecules 108 to the exposed surface of the $SiO_2$ first insulator film 102 is extremely slower than that to the surface of the multilayer wiring film and as a result, the absorption amount of the tungsten fluoride to the former is extremely small compared with that to the latter. Furthermore, the absorption condition of the tungsten fluoride is different from that to the wiring film, that is, since the first insulator film 102 contains no free electron, the energy transfer reaction does not occur and as a result, the tungsten fluoride molecules are absorbed without dissociation.

Then, the substrate 101 is taken out from the reaction chamber 107 to be exposed to the air as shown in FIG. 4E. During the process the tungsten layer 109 absorbed on the surface of the wiring film is not oxidized because the tungsten atoms are coupled with the gold atoms by the metallic bonds.

However, due to the fact that the oxide is smaller in free energy than the fluoride, the tungsten fluoride gas molecules absorbed onto the surface of the first insulator film 102 dissociate into fluorine atoms. The fluorine atoms thus generated are then coupled with oxygen atoms thereby to form a tungsten oxide 110.

As a result, even if the tungsten fluoride gas molecules 108 are absorbed to the surface of the first insulator film 102 during the absorption process, the interlayer short-circuit does not take place since the tungsten oxide 110 of a dielectric material is deposited on the surface of the first dielectric film 102. Accordingly, reduction of the production yield due to the interlayer short-circuit does not occur.

Subsequently, heat-treatment is applied to the substrate 101 at a temperature of 300° to 400° C. under a non-oxidative atmospheric condition to stabilize the absorbed tungsten layer 109. Then, as shown in FIG. 4F, the $SiO_2$ second insulator film 111 is formed on the entire surface of the tungsten layer 109 and the exposed surface of the $SiO_2$ first insulator film 102 by a plasma CVD technique with hydrogen silicide and nitrogen oxide as the source material gases. Thus, the semiconductor device of the first embodiment is obtained.

with the semiconductor device obtained by the production method of this embodiment, the surface of the multilayer wiring film is covered with the absorbed tungsten layer 109, in which peeling off due to thermal hysteresis and/or deterioration with time does not occur unlike the plasma-deposited silicon nitride film in the prior art. As a result, an improved adhesion property between the wiring film and the second insulator film 111 can be obtained, so that improvement in the production yield and a long-term reliability of the semiconductor device can be obtained. The interlayer capacity can be restricted because such a material having a high dielectric constant as the plasma-deposited nitride film is not employed.

In addition, since the tungsten layer 109 is made by a process of contacting the wiring film with the tungsten halogenide gas, without passing through any sophisticated process, the number of the production steps does not increase and the production yield is not reduced.

In addition, a severe or strict process control in the production process is not required and no problem about mask alignment accuracy and/or processing accuracy arises. There is also no problem about mask alignment accuracy and/or processing accuracy.

There is an additional advantage that largely contributes to high performance of the semiconductor device.

As an insulator film and a passivation film adjacent to the multilayer wiring film any organic or inorganic material can be employed.

[Second Embodiment]

A second embodiment of the present invention will be described below, which is the same in structure and fabrication method as those of the first embodiment excepting that a tungsten chloride ($WCl_6$) gas is employed during the process of forming the absorbed tungsten layer 109 instead of the tungsten fluoride ($WF_6$) gas.

First, through the same processes as in the first embodiment, a Si substrate 101 containing a multilayer wiring film thereon as shown in FIG. 4C is obtained and then, the substrate 101 is deposited in a reaction chamber 107 (see FIG. 4D). In the reaction chamber 107, the substrate 101 is subjected to the absorption process at a temperature of 300° to 400° C. and a gas pressure of 400 mTorr to several ones Torr for 5 to 10 minutes under the atmospheric condition of a tungsten chloride ($WCl_6$) gas.

Tungsten chloride has a melting point of 275° C. which is higher than that of tungsten fluoride and as a result, it is necessary in this embodiment to perform the absorption process at a higher temperature than that in the first embodiment.

During the absorption process, tungsten chloride gas molecules are absorbed on the surface of the multilayer wiring film, and the chlorine (Cl) atoms are dissociated due to the energy transfer reaction with the free electrons existing in the surface of the wiring film. The chlorine atoms thus generated are absorbed on the surface of the wiring layer to form a tungsten layer 109. The tungsten atoms are coupled with the gold atoms by the metallic bonds. The dissociated chlorine atoms are dissipated in the atmosphere.

The absorbed tungsten layer 109 is extremely small in thickness and low in coupling or bonding force to the surface of the wiring film as well as unstable in structure compared with that obtained through the reduction with hydrogen silicide ($SiH_4$) or hydrogen ($H_2$). If the tungsten layer 109 is intended to be thicker, similar to the first embodiment, it is necessary to increase the partial pressure of the tungsten fluoride gas and the temperature in the absorption process.

On the other hand, the absorption rate of the tungsten chloride gas molecules to the exposed surface of the $SiO_2$ first insulator film 102 is extremely slower than that to the surface of the multilayer wiring film and as a result, the absorption amount of the tungsten chloride to the former is extremely small compared with that to the latter. Furthermore, the absorption condition of the tungsten chloride is different from that to the wiring film, that is, since the first insulator film 102 contains no free electron, the energy transfer reaction does not occur and as a result, the tungsten chloride molecules are absorbed without dissociation.

Then, the substrate 101 is taken out from the reaction chamber 107 to be exposed to the air as shown in FIG. 4E. During the process the tungsten layer 109 absorbed on the surface of the wiring film is not oxidized because the tungsten atoms are coupled with the gold atoms by the metallic bonds.

However, due to the fact that the oxide is smaller in free energy than the fluoride, the tungsten chloride gas molecules absorbed onto the surface of the first insulator film 102 dissociate into chlorine atoms. The chlorine atoms thus generated are then coupled with oxygen atoms thereby to form a tungsten oxide 110.

As a result, even if the tungsten chloride gas molecules are absorbed to the surface of the first insulator film 102 during the absorption process, the interlayer short-circuit does not take place since the tungsten oxide 110 of a dielectric material is deposited on the surface of the first dielectric film 102. Accordingly, reduction of the production yield due to the interlayer short-circuit does not occur.

Subsequently, heat-treatment is applied to the substrate 101 at a temperature of 300° to 400° C. under a non-oxidative atmospheric condition to stabilize the absorbed tungsten layer 109. Then, as shown in FIG. 4F, a SiO₂ second insulator film 111 is formed on the entire surface of the tungsten layer 109 and the exposed surface of the SiO₂ first insulator film 102 by a plasma CVD technique with hydrogen silicide and nitrogen oxide as the source material gases. Thus, the semiconductor device of the second embodiment is obtained.

The semiconductor device obtained by the production method of the second embodiment provides the same effects and advantages as those obtained in the first embodiment.

[Third Embodiment]

A third embodiment of the present invention will be described below with reference to FIGS. 5A to 5C.

A semiconductor device of the third embodiment is the same in structure and fabrication method as those of the first embodiment excepting that an absorbed molybdenum layer is provided instead of the tungsten layer. As a result, the components having the same functions as those of the first embodiment are indicated by the same reference numerals and their explanations will be omitted for the sake of simplification.

Figure 5A:
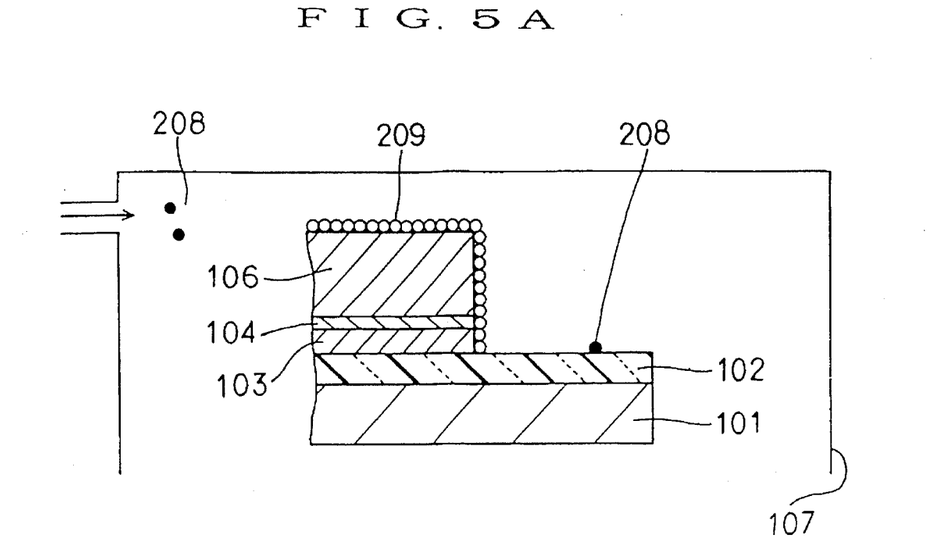
FIGS. 5A to 5C are partial cross-sectional views showing a production method of a semiconductor device according to a third embodiment of the present invention, respectively.

The semiconductor device of this embodiment is fabricated as follows;

First, through the same processes as in the first embodiment, a Si substrate 101 containing a multilayer wiring film thereon as shown in FIG. 4C is obtained and then, the substrate 101 is deposited in a reaction chamber 107 as shown in FIG. 5A. In the reaction chamber 107, the substrate 101 is subjected to the absorption process at a temperature of 100 to 400° C. and a gas pressure of 200 mTorr to several ones Torr for 5 to 10 minutes under the atmospheric condition of a molybdenum fluoride ($MoF_6$) gas.

Molybdenum fluoride has a boiling point of about 34° C. which is a little higher than that of 17° C. of tungsten fluoride and as a result, it is necessary in this embodiment to perform the absorption process at a little higher temperature than that in the first embodiment.

During the absorption process, molybdenum fluoride gas molecules are absorbed on the surface of the multilayer wiring film, and the fluorine (F) atoms are dissociated due to the energy transfer reaction with the free electrons existing in the surface of the wiring film. The fluorine atoms thus generated are absorbed on the surface of the wiring layer to form a molybdenum layer 209. The molybdenum atoms are coupled with the gold atoms by the metallic bonds. The dissociated fluorine atoms are dissipated in the atmosphere.

The absorbed molybdenum layer 209 is extremely small in thickness and low in coupling or bonding force to the surface of the wiring film as well as unstable in structure compared with that obtained through the reduction with hydrogen silicide ($SiH_4$) or hydrogen ($H_2$). If the molybdenum layer 209 is intended to be thicker, similar to the first embodiment, it is necessary to increase the partial pressure of the molybdenum fluoride gas and the temperature during the absorption process.

On the other hand, the absorption rate of the molybdenum fluoride gas molecules to the exposed surface of the SiO₂ first insulator film 102 is extremely slower than that to the surface of the multilayer wiring film and as a result, the absorption amount of the molybdenum fluoride to the former is extremely small compared with that to the latter. Furthermore, the absorption condition of the molybdenum fluoride is different from that to the wiring film, that is, since the first insulator film 102 contains no free electron, the energy transfer reaction does not occur and as a result, the molybdenum fluoride molecules are absorbed without dissociation.

Figure 5B:
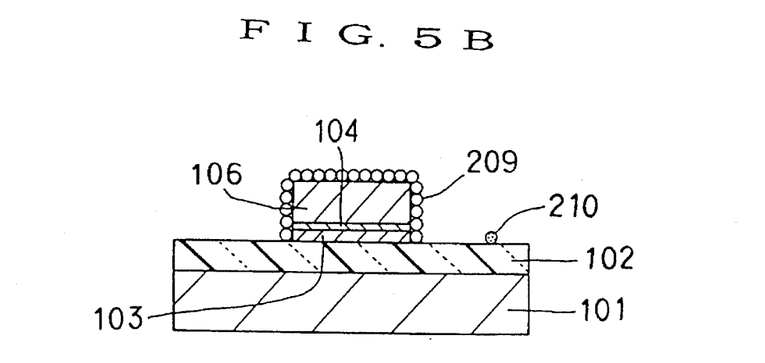
Figure 5C:
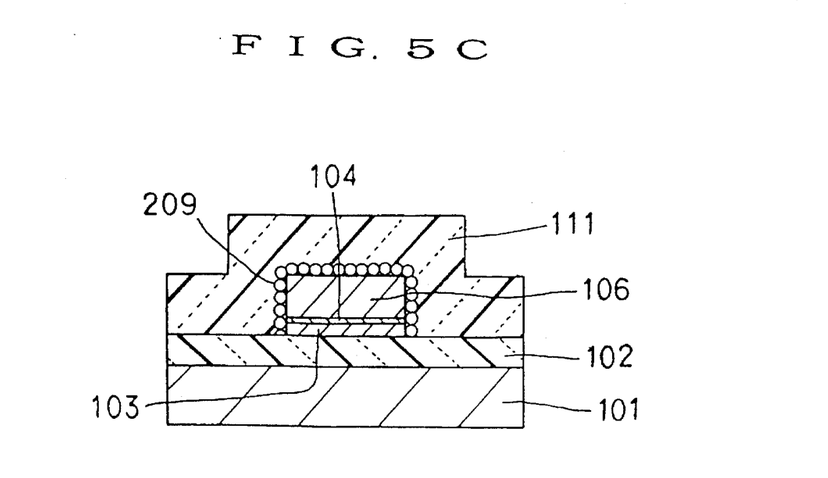

Then, the substrate 101 is taken out from the reaction chamber 107 to be exposed to the air as shown in FIG. 5B. During the process the molybdenum layer 209 absorbed on the surface of the wiring film is not oxidized because the molybdenum atoms are coupled with the gold atoms by the metallic bonds.

However, due to the fact that the oxide is smaller in free energy than the fluoride, the molybdenum fluoride gas molecules 208 absorbed onto the surface of the first insulator film 102 dissociate into fluorine atoms. The fluorine atoms thus generated are then coupled with oxygen atoms thereby to form a molybdenum oxide 210.

As a result, even if the molybdenum fluoride gas molecules are absorbed to the surface of the first insulator film 102 during the absorption process, the interlayer short-circuit does not take place since a molybdenum oxide 210 of a dielectric material is deposited on the surface of the first insulator film 102. Accordingly, reduction of the production yield due to the interlayer short-circuit does not occur.

Subsequently, heat-treatment is applied to the substrate 101 at a temperature of 300° to 400° C. under a non-oxidative atmospheric condition to stabilize the absorbed molybdenum layer 209. Then, as shown in FIG. 5C, an SiO₂ second insulator film 111 is formed on the entire surface of the molybdenum layer 209 and the exposed surface of the SiO₂ first insulator film 102 by a plasma-enhanced CVD technique with hydrogen silicide and nitrogen oxide as the source material gases. Thus, the semiconductor device of the third embodiment is obtained.

The semiconductor device obtained by the method of the third embodiment provides the same effects and advantages as those obtained in the first embodiment since it is provided with the molybdenum layer 209 instead of the tungsten layer 109.

The present invention can be applied to both MOS and bipolar semiconductor devices and yet, the semiconductor substrate thereof is not limited to silicon, but may use gallium arsenide (GaAs) and any other semiconductors.

What is claimed is:

1. A production method of a semiconductor device, comprising:

a first step of forming a first insulator film on a semiconductor substrate;

a second step of forming a patterned wiring film containing gold on said first insulator film;

a third step of contacting said wiring film and an uncovered area of said first insulator film with a halogenide gas of a metal so that said halogenide gas is absorbed onto said patterned wiring film without using a reduction gas for said halogenide, thereby forming a metal layer from said absorbed halogenide, said metal layer covering top and side surfaces of said patterned wiring film; and a fourth step of forming a second insulator film on said metal layer to cover its surface.

2. The production method as claimed in claim 1, wherein during said third step, molecules of said halogenide gas are absorbed onto said patterned wiring film, and atoms of said metal are dissociated from said halogenide;

and wherein during said third step, said atoms thus generated are then coupled with gold atoms contained in said wiring film by metallic bonds, resulting in said metal layer.

3. The production method as claimed in claim 1, wherein the metal is selected from the group consisting of tungsten (W) and molybdenum (Mo).

4. The production method as claimed in claim 1, wherein the halogenide is selected from the group consisting of tungsten fluoride ($WF_6$), tungsten chloride ($WCl_6$) and molybdenum fluoride ($MoF_6$).

5. The production method as claimed in claim 1, wherein said wiring film is of a multilayer structure made of first, second and third conductive layers, at least said third conductive layer containing gold;

and wherein said first conductive layer acts as a barrier for preventing atoms of said second conductive layer from entering said first conductive layer, said second conductive layer acts to improve adhesion to said first conductive layer, and said third conductive layer mainly acts as a wiring.

6. A production method of a semiconductor device, comprising:

a first step of forming a first insulator film on a semiconductor substrate;

a second step of forming a patterned wiring film containing gold on said first insulator film;

a third step of contacting said wiring film and an uncovered area of said first insulator film with a halogenide gas of a metal so that said halogenide gas is absorbed onto said patterned wiring film without using a reduction gas for said halogenide, thereby forming a metal layer from said absorbed halogenide, said metal layer covering top and side surfaces of said patterned wiring film;

a fourth step of exposing said metal layer and said uncovered area of said first insulator film to an oxidative atmosphere to oxidize said halogenide deposited on said uncovered area of said first insulator film; and a fifth step of forming a second insulator film on said metal layer to cover its surface.

7. The production method as claimed in claim 6, wherein during said third step, molecules of said halogenide gas are absorbed onto said patterned wiring film, and atoms of said metal are dissociated from said halogenide;

and wherein during said third step, said atoms thus generated are then coupled with gold atoms contained in said wiring film by metallic bonds, resulting in said metal layer.

8. The production method as claimed in claim 6, wherein the metal is selected from the group consisting of tungsten (W) and molybdenum (Mo).

9. The production method as claimed in claim 6, wherein the halogenide is selected from the group consisting of tungsten fluoride ($WF_6$), tungsten chloride ($WCl_6$) and molybdenum fluoride ($MoF_6$).

10. The production method as claimed in claim 6, wherein said wiring film is of a multilayer structure made of first, second and third conductive layers, at least said third conductive layer containing gold;

and wherein said first conductive layer acts as a barrier for preventing atoms of said second conductive layer from entering said first conductive layer, said second conductive layer acts to improve adhesion to said first conductive layer, and said third conductive layer mainly acts as a wiring.

11. A production method of a semiconductor device, comprising:

a first step of forming a first insulator film on a semiconductor substrate;

a second step of forming a patterned wiring film containing gold on said first insulator film;

a third step of contacting said wiring film and an uncovered area of said first insulator film with a halogenide gas of a metal so that said halogenide gas is absorbed onto said patterned wiring film without using a reduction gas for said halogenide, thereby forming a metal layer from said absorbed halogenide, said metal layer covering top and side surfaces of said patterned wiring film;

a fourth step of heat-treating said metal layer under a non-oxidative atmospheric condition to stabilize said metal layer; and a fifth step of forming a second insulator film on said metal layer to cover its surface.

12. The production method as claimed in claim 11, wherein during said third step, molecules of said halogenide gas are absorbed onto said patterned wiring film, and atoms of said metal are dissociated from said halogenide;

and wherein during said third step, said atoms thus generated are then coupled with gold atoms contained in said wiring film by metallic bonds, resulting in said metal layer.

13. The production method as claimed in claim 11, wherein the metal is selected from the group consisting of tungsten (W) and molybdenum (Mo).

14. The production method as claimed in claim 11, wherein the halogenide is selected from the group consisting of tungsten fluoride ($WF_6$), tungsten chloride ($WCl_6$) and molybdenum fluoride ($MoF_6$).

15. The production method as claimed in claim 11, wherein said wiring film is of a multilayer structure made of first, second and third conductive layers, at least said third conductive layer containing gold;

and wherein said first conductive layer acts as a barrier for preventing atoms of said second conductive layer from entering said first conductive layer, said second conductive layer acts to improve adhesion to said first conductive layer, and said third conductive layer mainly acts as a wiring.

16. A production method of a semiconductor device, comprising:

a first step of forming a first insulator film on a semiconductor substrate;

a second step of forming a first conductor film on said first insulator film;

a third step of forming a second conductor film on said first conductor film;

a fourth step of selectively forming a third conductor film containing gold on said second conductor film;

a fifth step of patterning said first and second conductor films using said third conductor film as a mask, said first, second and third conductor films patterned forming a multilayer wiring structure;

a sixth step of contacting said multilayer wiring structure and an uncovered area of said first insulator film with a halogenide gas of a metal so that said halogenide gas is absorbed on said wiring structure without using a reduction gas for said halogenide, thereby forming a metal layer from said absorbed halogenide, said metal layer covering top and side surfaces of said wiring structure;

a seventh step of exposing said metal layer and said uncovered area of said first insulator film to an oxidative atmosphere to oxidize said halogenide deposited on said uncovered area of said first insulator film;

an eighth step of heat-treating said metal layer under a non-oxidative atmospheric condition to stabilize said metal layer; and a ninth step of forming a second insulator film on said metal layer to cover its surface.

17. The production method as claimed in claim 16, wherein during said sixth step, molecules of said halogenide gas are absorbed onto said wiring structure, and atoms of said metal are dissociated from said halogenide;

and wherein during said sixth step, said atoms thus generated are then coupled with gold atoms contained in said third conductive film by metallic bonds, resulting in said metal layer.

18. The production method as claimed in claim 16, wherein the metal is selected from the group consisting of tungsten (W) and molybdenum (Mo).

19. The production method as claimed in claim 16, wherein the halogenide is selected from the group consisting of tungsten fluoride ($WF_6$), tungsten chloride ($WCl_6$) and molybdenum fluoride ($MoF_6$).

* * * * *